(12) United States Patent
Shu et al.

(10) Patent No.: US 6,701,199 B1
(45) Date of Patent: Mar. 2, 2004

(54) METHODOLOGY TO OBTAIN INTEGRATED PROCESS RESULTS PRIOR TO PROCESS TOOLS BEING INSTALLED

(75) Inventors: Cheng Chor Shu, Woodlands Crescent (SG); Cho Nam Hoon, Maplewoods Condo (SG); Leong Chee Kong, Singapore (SG); Pete Benyon, Singapore (SG); Johnny Cham, Singapore (SG); George Wong, Singapore (SG); Neoh Soon Ee, Singapore (SG)

(73) Assignee: Chartered Semiconductor Manufactoring Ltd., Singapore (SG)

(*) Notice: Subject to any disclaimer, the term of this patent is extended or adjusted under 35 U.S.C. 154(b) by 0 days.

(21) Appl. No.: 10/225,804

(22) Filed: Aug. 22, 2002

(51) Int. Cl.7 .................. G06F 19/00; G06F 17/50; G06G 7/62
(52) U.S. Cl. ........................... 700/95; 703/13
(58) Field of Search ............... 700/90, 95, 99, 700/97, 105, 111, 121, 29; 703/13

(56) References Cited

U.S. PATENT DOCUMENTS

| | | | | |
|---|---|---|---|---|
| 3,703,725 A | * | 11/1972 | Gomersall et al. ............ | 700/97 |
| 5,105,362 A | * | 4/1992 | Kotani ........................ | 700/108 |
| 5,655,110 A | * | 8/1997 | Krivokapic et al. .......... | 716/19 |
| 5,694,325 A | * | 12/1997 | Fukuda et al. ............... | 700/121 |
| 5,761,064 A | | 6/1998 | La et al. ................ | 364/468.17 |
| 6,223,093 B1 | * | 4/2001 | Kitamura .................... | 700/104 |
| 6,256,549 B1 | | 7/2001 | Romero et al. ............. | 700/121 |
| 6,263,255 B1 | | 7/2001 | Tan et al. .................... | 700/121 |
| 2002/0156548 A1 | * | 10/2002 | Arackaparambil et al. .. | 700/108 |

* cited by examiner

Primary Examiner—Leo Picard
Assistant Examiner—Ryan Jarrett
(74) Attorney, Agent, or Firm—George O. Saile; Rosemary L. S. Pike

(57) ABSTRACT

In accordance with the objectives of the invention a new methodology is provided that assures that integrated process results are verified and assured prior to the installation of processing tools as part of modifying or updating of a semiconductor manufacturing foundry. The complete semiconductor manufacturing complement of processing tools is sub-divided into short-loops or sub-modules, which are then combined into a full loop. This combination of sub-modules into modules that closer approach a full complement of processing tools can be accomplished in a gradual manner, whereby one or more sub-loops are first combined and evaluated, to this combination one or more additional sub-groups may be added whereby each of these latter sub-groups may also have been created by combining one or more (original) sub-loops. This process is continued to the point where a full complement of process equipment has been created, completing the full processing loops of the semiconductor manufacturing facility.

7 Claims, 3 Drawing Sheets

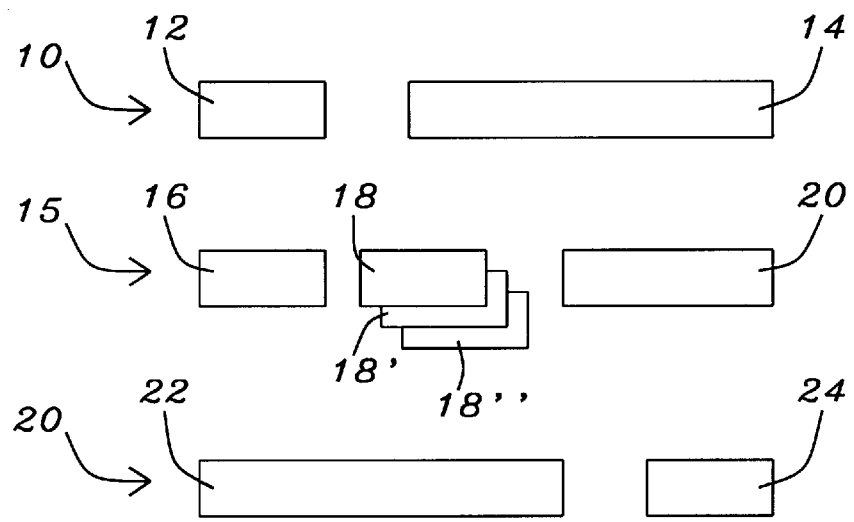
FIG. 1 – Prior Art
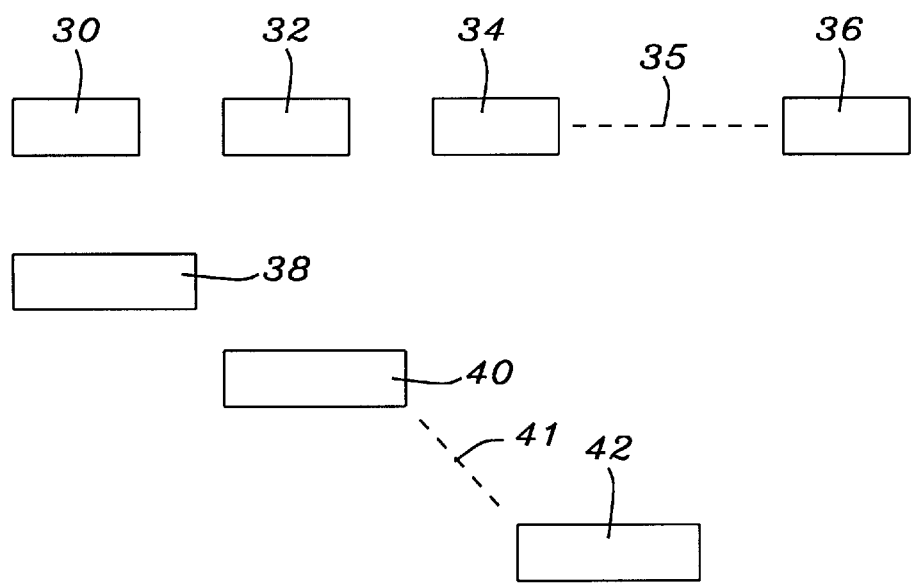
FIG. 2

METHODOLOGY TO OBTAIN INTEGRATED PROCESS RESULTS PRIOR TO PROCESS TOOLS BEING INSTALLED

BACKGROUND OF THE INVENTION (1) Field of the Invention

The invention relates to the fabrication of integrated circuit devices, and more particularly, to a method of ensuring improved new tool selection, of reducing the number of iterative learning cycles required for the installation of new processing tools and of accelerating start-up of new processing tools.

(2) Description of the Prior Art

The creation of semiconductor devices typically requires numerous steps processing that have to meet the most stringent requirements of performance, cost objectives, high technical capabilities and the like. The capital that is invested to create a modern semiconductor manufacturing foundry is considerable and must therefore be balanced against large volume of production in order to make the incurred manufacturing cost per device acceptable. In addition, the art of creating semiconductor devices is a very dynamic undertaking that requires constant modifications to the existing facilities and processing tools so that competitive pressures can be met and a market position can be maintained. Therefore, not only is the initial investment a significant burden to the cost of creating semiconductor devices but this burden is constantly extended over time to be carried by present and future technologies.

Many adaptations to new processing requirements can be addressed and solved by modifying existing tools or by changing conditions of processing or materials that are applied for the process. In many applications however this approach of updating the existing is not adequate to adequately address future requirements in which case new processing tools must be provided. New processing tools offer a new set of challenges, which in most cases result in additional cost incurred by the product, a cost that is further aggravated by new procedures that must be implemented, a learning curve that must be passed in order to gain operational familiarity with the new tool, possible new materials that must be acquired and integrated into the new processing procedures, and the like. All of these aspects are inherently time-consuming and therefore inherently expensive. Many of the new tools may further require housing such tools in facilities that must meet new and upgraded requirements of clean room environment or absence of vibration or other environmental impacts on the new tools. It is not uncommon that a new building is created just to house delicate and vibration sensitive tool such as X-ray equipment or E-beam devices.

The above highlighted impact that is caused by keeping a semiconductor manufacturing facility up to date and competitive is by no means an exhaustive listing of considerations that affect such an effort of updating the processing tools and facilities. It is clear however from even such a short listing that the cost incurred in any modification of a semiconductor manufacturing environment can be significant and must therefore be a major consideration before such an action is taken.

It is therefore highly beneficial if, instead of performing an update to the manufacturing facilities by installing tools and incurring the therewith-associated cost, another method is found to simulate the operational and interactive impact of such an update.

In view of the processing capabilities of even a modestly complex computer or software program, it can be considered a natural extension of a computer program to design and use a computer program that is instrumental in addressing problems associated with acquiring, installing etc. of new, modified processing tools or even of reinstalling previously used processing tools.

Another approach is provided by sub-dividing a complete processing cycle into modules, so that each individual and identifiable unit, which comprises a sub-section of a complete or partially complete processing arrangement, can be analyzed. The invention addresses such an approach.

U.S. Pat. No. 6,263,255 (Tan et al.) shows a process control system for tools using feed forward and feed back U.S. Pat. No. 5,761,064 (La et al.) shows a defect management system to improve semiconductor yields.

U.S. Pat. No. 6,256,549 B1 (Romero et al.) shows an integrated manufacturing solution.

SUMMARY OF THE INVENTION

A principle objective of the invention is to provide a method that ensures improved tool selection for modification or updating of a semiconductor manufacturing foundry.

Another objective of the invention is to reduce the number of iterative learning cycles that are typically required for modification or updating of a semiconductor manufacturing foundry.

Yet another objective of the invention is to provide a method that allows accelerated process and fabrication start-up after modification or updating of a semiconductor manufacturing foundry.

In accordance with the objectives of the invention a new methodology is provided that assures that integrated process results are verified and assured prior to the installation of processing tools as part of modifying or updating of a semiconductor manufacturing foundry. The complete semiconductor manufacturing complement of processing tools is sub-divided into short-loops or sub-modules, which are then combined into a full loop. This combination of sub-modules into modules that closer approach a full complement of processing tools can be accomplished in a gradual manner, whereby one or more sub-loops are first combined and evaluated, to this combination one or more additional sub-groups may be added whereby each of these latter sub-groups may also have been created by combining one or more (original) sub-loops. This process is continued to the point where a full complement of process equipment has been created, completing the full processing loops of the semiconductor manufacturing facility.

BRIEF DESCRIPTION OF THE DRAWINGS

FIG. 1 is a presentation of the conventional method of updating a semiconductor processing facility.

FIG. 2 is a presentation of the method of the invention of updating a semiconductor processing facility.

DESCRIPTION OF THE PREFERRED EMBODIMENTS

Figure 3:
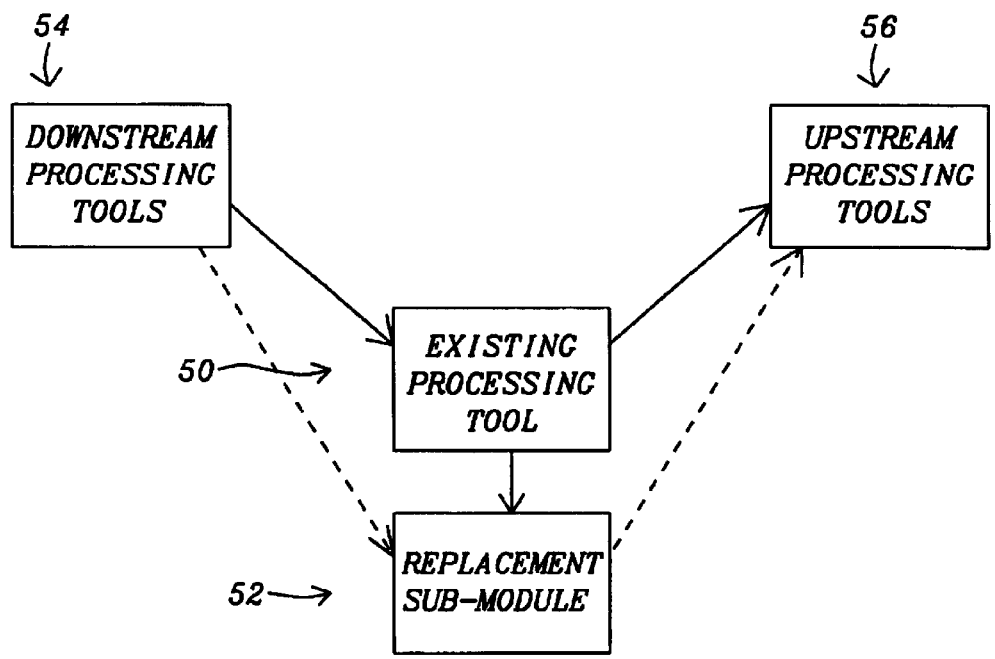

First specifically referring to FIG. 1, there is shown a conventional method of updating a semiconductor processing facility.

Shows in schematic form in FIG. 1 are the three possible combinations of introducing one or more new processing tools into an existing processing tool configuration, that is:

10, the new processing tool is positioned before or in a down-stream location of existing tools 12, the new processing tool is positioned within the sequence of existing tools, and 14, the new processing tool is positioned behind or in an up-stream location of existing tools.

Specifically highlighted are the following new and existing or old processing tools:

under arrangement 10, the new tool is tool 12 which is positioned before the old processing tool 14; it is thereby assumed that semiconductor wafer and other processing proceeds from a left to a right direction of the diagrams that are shown in FIG. 1, that is from tool 12 (the new tool) to tool 14 (the old tool)

under arrangement 15, the new tool or tools 18/18'/18" are positioned after the old tool 16 and before the old processing tool 20; it is thereby assumed that semiconductor wafer and other processing proceeds from a left to a right direction of the diagrams that are shown in FIG. 1, that is from tool 16 (an old tool) to tool 20 (another old tool), and under arrangement 20, the new tool 24 is positioned after the old processing tool 22; it is thereby assumed that semiconductor wafer and other processing proceeds from a left to a right direction of the diagrams that are shown in FIG. 1, that is from tool 22 (the old tool) to tool 24 (the new tool).

From the re-configurations that are shown in FIG. 1, whereby each of these reconfigurations is aimed at introducing one or more new tools into an existing sequence of semiconductor processing tools, it is clear that the only way in which process integration for the modified sequence of processing tools can be achieved is by evaluation of the impact of the new tool or tools after the new tools have been installed. Prior to the process of installing a new processing tool, as shown in the diagrams of FIG. 1, insight can be gained into the performance of one or more new tools by for instance tool vendor demonstrations and instructional or educational efforts. This however does not address the concern of how the new tool or tools will operate once this new tool or tools have been installed into the new modified sequence of processing tools. This can, with the tool updating and integration scheme that is currently used and as shown in FIG. 1, only be accomplished after the new tool or tools have been installed and after these new tools are elevated to operational status within the sequence of processing tools of which old or existing processing tools remain a part.

The current practice of updating a sequence of processing tools typically results in extended efforts requiring a prolonged period of time before the new tool or tools are integrated into the new processing sequence. New processing conditions must be evaluated in depth, the interfacing of the new tool or tools with the old tools must be evaluated and the like. All of these activities are performed to the point where a valid and adequate basis for acceptance of the new tool has been established and where the new tool or tools are judged to be operational in the modified processing environment.

The invention addresses the above highlighted problems that are conventionally encountered when updating a semiconductor processing arrangement by providing a Pre-delivery Module Integration Preparation (PMIP) methodology that removes most if not all of the conventionally encountered disadvantages of installing new processing tools. This will be further explained in detail using FIG. 2 for this purpose.

Referring now specifically to the diagram that is shown in FIG. 2, therein are highlighted the following elements of the following discussion:

30, 32, 34 and 36 are new tools that can sequentially be extended with extension 35 into more new tools than have been highlighted in FIG. 2, and 38, 40 and 42 are sub-modules of new tools, each sub-module comprising at least one new tool, the sub-modules can sequentially be extended with extension 41 into more sub-modules than have been highlighted in FIG. 2.

Keeping in mind the above-identified arrangements of new tools and sub-modules comprising new tools, the following observations relating thereto can be made.

A conventional process flow is, over the complement of tools where existing or old tools must be replaced by new tools, sub-divided into clearly defined sub-modules whereby each sub-module comprises at least one new processing tool. Emphasis must be placed on the above stated "over the complement of tools where existing or old tools must be replaced by new tools".

This sub-division takes into account practical considerations of which a main consideration is that the new tool or tools are being delivered by a common vendor.

The tools that constitute a sub-module are then completely evaluated for processing capabilities and performance, thereby including to the maximum extent possible the interfacing of the first and the last tool within the sub-module with the processing sequence into which this sub-module must be integrated at a later time.

In short: the sub-module is treated as a unit, independent of existing processing equipment into which the new sub-module must be integrated, and is evaluated to the maximum extent possible. The evaluation of the sub-module comprises the complete evaluation of the stand-alone sub-module and, to the maximum extent possible, the evaluation of the effect that interfacing old processing equipment with the sub-module may have on the sub-module, specifically on the first and the last tool within the sub-module.

The first tool within a sub-module is understood to be the tool within the sub-module in which a semiconductor wafer or device that is being processed is processed before all other tools in that sub-module.

The last tool within a sub-module is understood to be the tool within the sub-module in which a semiconductor wafer or device that is being processed is processed after processing by all other tools in that sub-module has been completed.

In between the first and the last tool the remaining tools that are part of the sub-module are arranged in a sequential order that coincides with the order in which the semiconductor wafer or device that is processed by the sub-module proceeds through the sub-module.

The objective of creating the sub-modules of semiconductor processing tools is to ensure the complete integration from an operational and processing point of view of the processing tools contained in the sub-module.

All parameters that apply to this complete integration are observed and analyzed to the point where the operational capabilities of the sub-module are completely understood and verified. Included in this observation and analysis are, to the maximum extent possible, the effects that interfacing processing equipment have on the first and the last processing tool in the sub-module.

These effect may be simulated by computer based software means or may be simulated by hardware means. As an example of the latter can be cited the closing of a resistive loop with the characteristic impedance of that loop in order to remove electrical reflections within the loop. Similar means for matching or adaptation may be provided for the numerous situations that can arise when interfacing new processing tools with old processing tools, dependent on the type of tool and the type of interfacing between tools.

From the above detailed concept of a sub-module, it is easy to extend a sub-module by the addition of one or more processing tools to the sub-module after which the now extended sub-module can again be evaluated to the maximum extent possible.

This extension of a previously completed and evaluated sub-module may for instance advantageously be applied if one or more pieces of new equipment become available and these one or more new pieces of equipment can be integrated with an existing sub-module located on the premises of the semiconductor manufacturing foundry, that is no longer located on the premises of the original equipment vendor.

The objective of adding one or more pieces of new equipment to a previously created and verified sub-module is to prepare new processing tools as much as possible for actual processing operations prior to the integration of the new processing tools into an existing processing line. By therefore including one or more new processing tools to a previously created and verified sub-module, the scope of the new equipment that is evaluated prior to integration with the existing processing tools is extended, thus reducing the potential impact of the installation of the new processing tools on the integrated processing line.

The PMIP methodology of the invention further provides advantages of gradual integration of processing tools and of reducing the impact of complicated and difficult to integrate processing steps on the integrated processing line. Difficult to integrate processing steps can first be verified and can, after verification, be gradually expanded to include additional processing steps, all of this leading to a controlled manner of updating an existing line of processing equipment.

It is thereby of advantage to first create sub-modules that most closely affect initial processing of semiconductor wafers or devices. This follows from the observation that for these (most initial) processing steps the thereby executed process is frequently relatively less complex than subsequent steps of processing and, in addition, are performed on semiconductor wafers or devices that are as yet in a more unprocessed state.

It is thereby also possible to integrate one or more sub-modules that have been completed and evaluated and perform this integration prior to installing these one or more now newly integrated sub-modules into the conventional processing line.

This also further meets the objective of installing new processing tools that have been evaluated to the maximum extent possible prior to installation of the new processing tools, whereby this extent covers not only the depth of the evaluation of the stools comprising a sub-module but also includes the maximum number of new processing tools that can be integrated prior to installing the complete complement of new processing tools into the conventional sequence of processing tools.

After the one or more sub-modules that have been described above have been installed in the now updated processing line, these tools are no longer "new" elements in the updated processing line in view of the in-depth preparation of the new processing tools prior to installation. Problems that therefore arise in the updated processing line can in most cases be relatively quickly assigned to an area of the updated processing line that by and large excludes the newly installed processing tools since these new processing tools have previously been evaluated. This greatly reduces the potential for extensive debug and analysis of the updated processing line after the new processing tools have been installed in the processing line.

To summarize, the invention provides for:
an extensive review and analysis of one or more new processing tools prior to the installation of these processing tools in a semiconductor processing line
for extending the scope of the new processing tools that are analyzed prior to installation in a semiconductor processing line, and
for evaluating the impact that interface processing tools have on newly installed processing tools.

All of the above leads to significantly reducing the conventional impact that the installation of new processing tools has on an existing line-up of processing tools.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

An alternate manner in which the invention, which provides a methodology to obtain integrated semiconductor device processing results prior to installing semiconductor device processing tools in a semiconductor device processing line, can be understood is shown in FIG. 3, wherein specifically are highlighted:
at least one first existing semiconductor device processing tool 50 being replaced in an existing semiconductor device processing line
the at least one first existing semiconductor device processing tool 50 being assigned to at least one first replacement sub-module 52 comprising replacement processing tools.

The invention then continues by evaluating the at least one first replacement sub-module 52 for performance and by simulating effects of down-stream (54) and up-stream (56) existing processing tools on the at least one first replacement sub-module 52, whereby down-stream existing processing tools 54 precede the at least one first replacement sub-module 52 in a sequence of semiconductor device processing steps while the up-stream existing processing tools 56 follow the at least one first replacement sub-module 52 in the sequence of semiconductor device processing steps.

Figure 4:
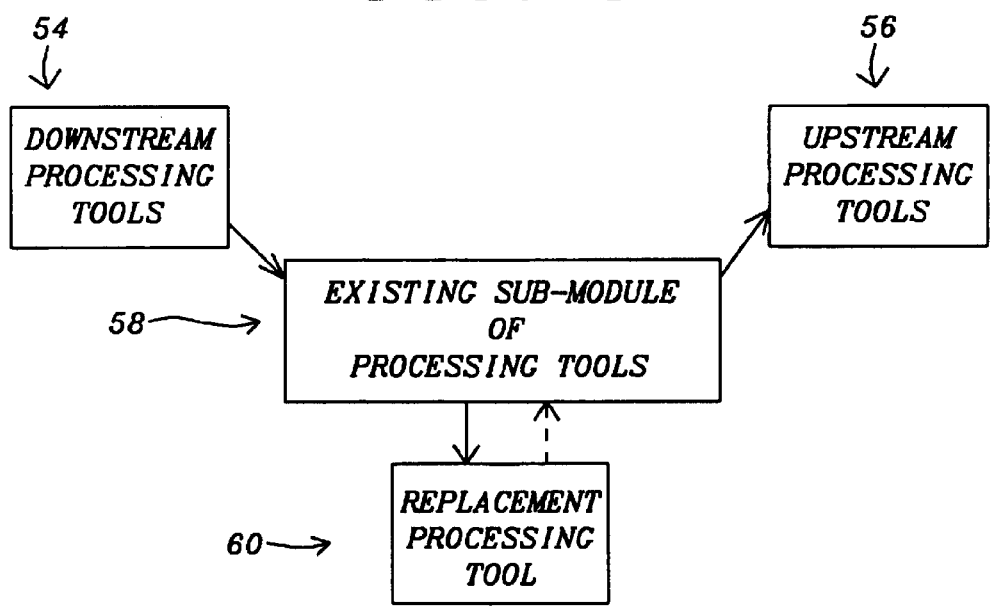

Alternately, the invention may be described as a methodology to obtain integrated semiconductor device processing results prior to installing semiconductor device processing tools in a semiconductor device processing line, by, as highlighted in FIG. 4:
identifying at least one first existing sub-module 58 comprising at least one existing semiconductor device processing tool being replaced in an existing semiconductor device processing line by at least one replacement semiconductor device processing tool 60
evaluating the at least one replacement semiconductor device processing tool 60 for performance and simulating effects of down-stream (54) and up-stream (56) existing processing tools on the at least one replacement semiconductor device processing tool 60, whereby down-stream existing processing tools 54 precede the at least one replacement semiconductor device processing tool 60 in a sequence of semiconductor device processing steps while the up-stream existing processing tools 56 follow the at least one replacement semiconductor device processing tool 60 in the sequence of semiconductor device processing steps.

Figure 5:
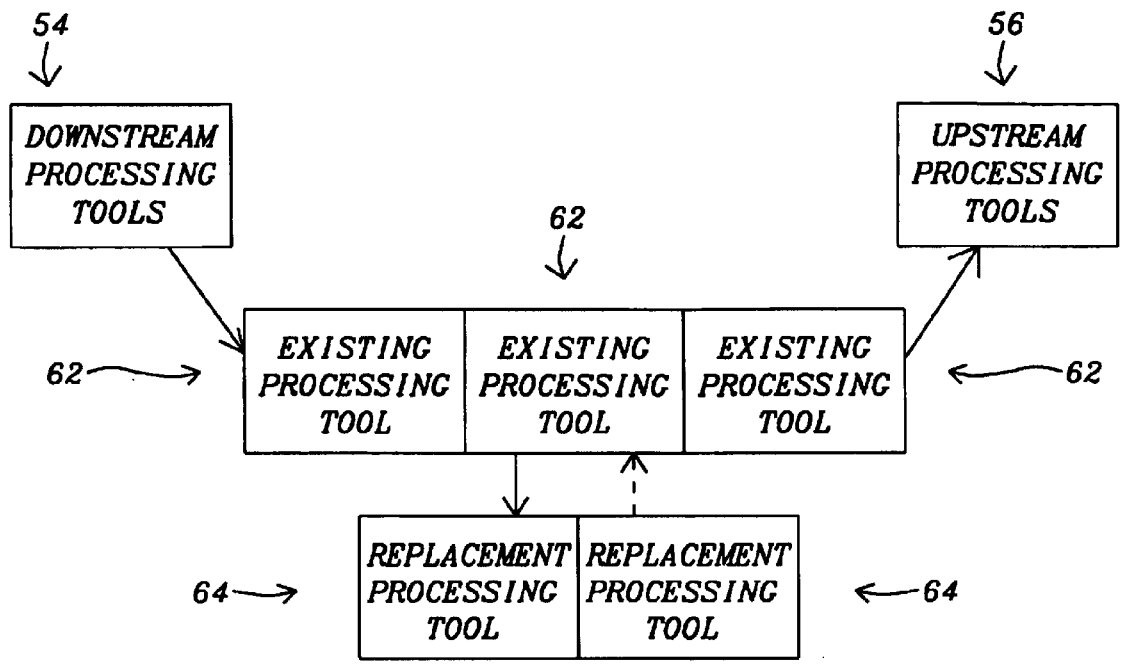

Alternately yet, as highlighted in FIG. 5, the invention can be described as a methodology to obtain integrated semiconductor device processing results prior to installing semiconductor device processing tools in a semiconductor device processing line, by:

identifying a multiplicity 62 of existing semiconductor device processing tools being replaced in an existing semiconductor device processing line assigning at least one existing semiconductor device processing tool of the multiplicity 62 of existing semiconductor device processing tools to at least one sub-module 64 of replacement semiconductor device processing tools, creating at least one sub-module 64 of replacement semiconductor device processing tools, and evaluating the at least one sub-module 64 of replacement semiconductor device processing tools for performance and simulating effects of down-stream (54) and up-stream (56) existing processing tools on-the at least one sub-module 64 of replacement semiconductor device processing tools.

Figure 6:
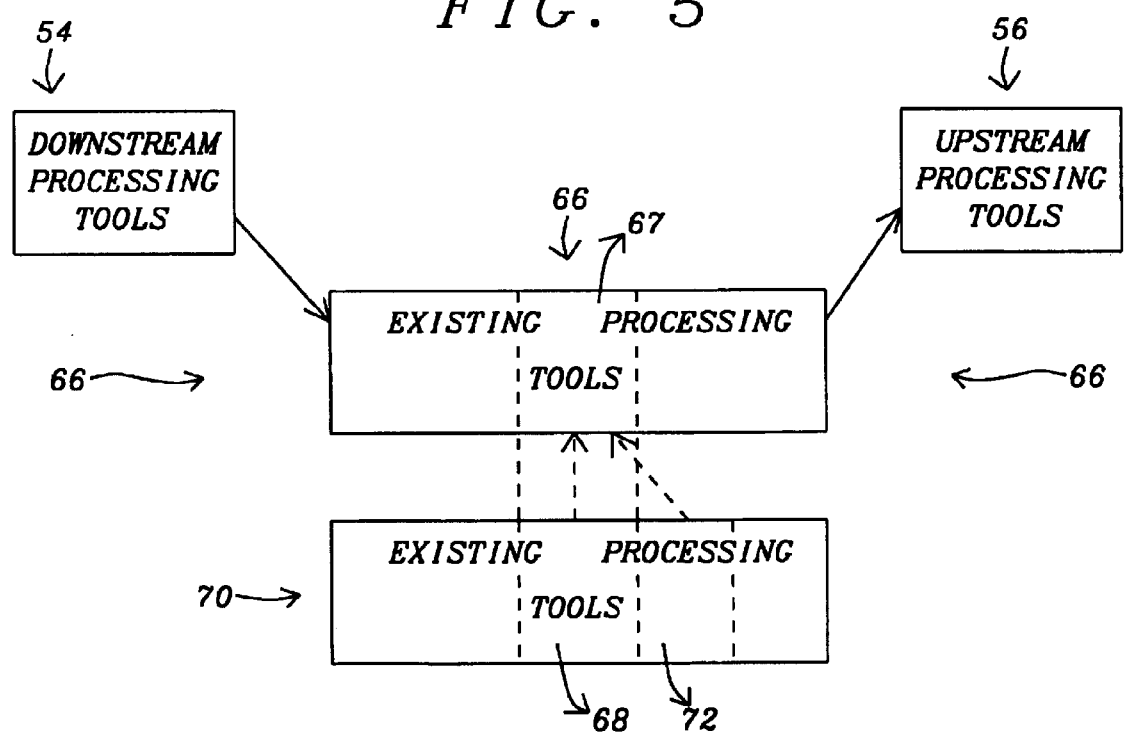

Alternately yet again, the invention provides a methodology to obtain integrated semiconductor device processing results prior to installing semiconductor device processing tools in a semiconductor device processing line, by, as shown in FIG. 6:

identifying a multiplicity 66 of existing processing tools being replaced in an existing semiconductor device processing line assigning at least one existing processing tool 67 of the multiplicity of existing processing tools 66 to at least one sub-module 68 of replacement semiconductor device processing tools 70, creating a multiplicity of sub-modules of replacement semiconductor device processing tools 70 combining at least one first member 68 of the multiplicity 70 of sub-modules of replacement semiconductor device processing tools with at least one second member 72 of the multiplicity 70 of sub-modules of replacement semiconductor device processing tools, creating at least one new level sub-module 68/72 of replacement semiconductor device processing tools evaluating the at least one new level sub-module 68/72 of replacement semiconductor device processing tools for performance, and simulating effects of down-stream (54) and up-stream (56) existing semiconductor device processing tools on the at least one new level sub-module 68/72 of replacement semiconductor device processing tools.

What is claimed is:

1. A methodology to obtain integrated semiconductor device processing results prior to installing semiconductor device processing tools in a semiconductor device processing line, comprising:

identifying at least one first existing semiconductor device processing tool being replaced in an existing semiconductor device processing line;

assigning said at least one first existing semiconductor device processing tool to at least one first replacement sub-module comprising replacement processing tools;

evaluating said at least one first replacement sub-module for performance; and simulating effects of down-stream and up-stream existing processing tools on said at least one first replacement sub-module, whereby down-stream existing processing tools precede said at least one first replacement sub-module in a sequence of semiconductor device processing steps while said up-stream existing processing tools follow said at least one first replacement sub-module in said sequence of semiconductor device processing steps.

2. The methodology of claim 1, expanding said at least one first replacement sub-module of processing tools by assigning at least one second existing processing tool to said at least one first sub-module of replacement processing tools.

3. The methodology of claim 1, expanding said at least one first sub-module of replacement processing tools by assigning a multiplicity of existing processing tools to said at least one first sub-module of replacement processing tools.

4. A methodology to obtain integrated semiconductor device processing results prior to installing semiconductor device processing tools in a semiconductor device processing line, comprising:

identifying at least one first existing sub-module comprising at least one existing semiconductor device processing tool being replaced in an existing semiconductor device processing line by at least one replacement semiconductor device processing tool; evaluating said at least one replacement semiconductor device processing tool for performance; and simulating effects of down-stream and up-stream existing processing tools on said at least one replacement semiconductor device processing tool, whereby down-stream existing processing tools precede said at least one replacement semiconductor device processing tool in a sequence of semiconductor device processing steps while said up-stream existing processing tools follow said at least one replacement semiconductor device processing tool in said sequence of semiconductor device processing steps.

5. The methodology of claim 4, expanding said at least one first existing sub-module by assigning a multiplicity of existing processing tools to said at least one first existing sub-module of processing tools.

6. A methodology to obtain integrated semiconductor device processing results prior to installing semiconductor device processing tools in a semiconductor device processing line, comprising:

identifying a multiplicity of existing semiconductor device processing tools being replaced in an existing semiconductor device processing line;

assigning at least one existing semiconductor device processing tool of said multiplicity of existing semiconductor device processing tools to at least one sub-module of replacement semiconductor device processing tools, creating at least one sub-module of replacement semiconductor device processing tools;

evaluating said at least one sub-module of replacement semiconductor device processing tools for performance; and simulating effects of down-stream and up-stream existing processing tools on said at least one sub-module of replacement semiconductor device processing tools.

7. A methodology to obtain integrated semiconductor device processing results prior to installing semiconductor device processing tools in a semiconductor device processing line, comprising:

identifying a multiplicity of existing processing tools being replaced in an existing semiconductor device processing line;

assigning at least one existing processing tool of said multiplicity of existing processing tools to at least one sub-module of replacement semiconductor device processing tools, creating a multiplicity of sub-modules of replacement semiconductor device processing tools;

combining at least one first member of said multiplicity of sub-modules of replacement semiconductor device processing tools with at least one second member of said multiplicity of sub-modules of replacement semiconductor device processing tools, creating at least one new level sub-module of replacement semiconductor device processing tools;

evaluating said at least one new level sub-module of replacement semiconductor device processing tools for performance; and simulating effects of down-stream and up-stream existing semiconductor device processing tools on said at least one new level sub-module of replacement semiconductor device processing tools.

* * * * *

UNITED STATES PATENT AND TRADEMARK OFFICE
CERTIFICATE OF CORRECTION

PATENT NO. : 6,701,199 B1  
DATED : March 2, 2004  
INVENTOR(S) : Cheng Chor Shu et al.

It is certified that error appears in the above-identified patent and that said Letters Patent is hereby corrected as shown below:

<u>Title page</u>,
Item [75], Inventors, delete "Cheng Chor Shu, Woodlants Crescent (SG)" and replace with -- Cheng Chor Shu, Singapore (SG) -- and delete "Cho Nam Hoon, Maplewoods Condo (SG)" and replace with -- Cho Nam Hoon, Singapore (SG) --.

Signed and Sealed this

Eleventh Day of May, 2004

JON W. DUDAS
*Acting Director of the United States Patent and Trademark Office*